United States Patent [19]

Cross

[11] Patent Number: 4,771,231
[45] Date of Patent: Sep. 13, 1988

[54] MICROWAVE OSCILLATOR WITH OPTICAL READOUT OF RESONANCE PHENOMENA

[75] Inventor: Michael A. Cross, Severna Park, Md.

[73] Assignee: Westinghouse Electric Corp., Pittsburgh, Pa.

[21] Appl. No.: 121,015

[22] Filed: Nov. 16, 1987

[51] Int. Cl.$^4$ ............................................. G01R 23/16
[52] U.S. Cl. ............................... 324/77 K; 331/107 A
[58] Field of Search ................. 324/77 K; 331/107 A; 333/188, 187; 350/358, 371, 372, 373

[56] References Cited

U.S. PATENT DOCUMENTS

| | | | |
|---|---|---|---|
| 3,655,265 | 4/1972 | Hammond | 350/372 |
| 4,023,120 | 5/1977 | Hartemann | 333/187 |
| 4,074,213 | 2/1978 | Epztein et al. | 333/187 |
| 4,245,193 | 1/1981 | Pan et al. | 331/107 A |
| 4,573,027 | 2/1986 | Buchalter et al. | 333/17 R |

Primary Examiner—Stewart J. Levy
Assistant Examiner—Louis M. Arana
Attorney, Agent, or Firm—R. P. Lenart

[57] ABSTRACT

A microwave oscillator circuit having a voltage controlled oscillator for producing a controllable frequency microwave signal and a high overtone bulk acoustic resonator coupled to receive the signal is provided with a light source for directing a light beam onto the resonator such that the light is diffracted in response to the presence of acoustic waves produced in the resonator by the microwave signal. Diffracted and undiffracted portions of the light beam are measured and compared to provide an indication of resonance phenomena within the high overtone bulk acoustic resonator. This technique is particularly applicable to frequency agile stable local oscillators in radar equipment. Optical data extraction is completely non-invasive with respect to the microwave circuit functions, resulting in unimpaired stable local oscillator operation.

7 Claims, 2 Drawing Sheets

MICROWAVE OSCILLATOR WITH OPTICAL READOUT OF RESONANCE PHENOMENA

BACKGROUND OF THE INVENTION

This invention relates to microwave oscillator circuits and more particularly to a system and method for measuring resonance phenomena in such circuits.

Radar stable local oscillators are becoming increasingly sophisticated with a continuing trend toward better short term stability coupled with fast wide range frequency agility. Recently developed high overtone bulk acoustic resonator (HBAR) technology has permitted direct stabilization of microwave oscillators with significantly improved short term frequency stability. This may be achieved by using a high Q HBAR resonance to filter the output of a microwave voltage control oscillator (VCO), with the filtered output furnishing a reference for a phase locked loop containing the VCO. When frequency agility is required, the system is configured such that the VCO is prepositioned close enough to an HBAR resonance such that the stabilization feedback loop can complete lock-up. Because a typical HBAR may exhibit as many as 200 resonances spaced at say 5 megahertz intervals, it is important to know which of these the loop has locked onto, particularly in systems requiring rapid frequency agility. Conventional methods of heterodyning down and frequency counting require a significant body of electronics and demand good local oscillator stability. Such a technique is cumbersome and relatively slow, hence not well suited for use with fast frequency agile sources. Therefore, there is a need for a means of rapid identification of the controlling HBAR resonance, preferably with some indication of microwave signal quality as lock-up is achieved, in a manner which has minimal impact on the microwave circuitry and no adverse effects on circuit operation.

SUMMARY OF THE INVENTION

This invention encompasses a circuit and method which provides an optical readout of HBAR resonance phenomena in a microwave oscillator circuit, that is independent of the specific microwave circuitry associated with the HBAR, as used in radar stable local oscillator applications.

A microwave oscillator circuit constructed in accordance with this invention includes a voltage controlled oscillator producing a controllable frequency microwave signal and a high overtone bulk acoustic resonator coupled to receive the microwave signal, thereby creating an acoustic wave within the high overtone bulk acoustic resonator. A light source is provided for directing light through the high overtone bulk acoustic resonator such that the light is diffracted in response to the presence of acoustic waves in the high overtone bulk acoustic resonator. Detection and processing circuitry is provided for measuring the ratio of the intensities of the diffracted and undiffracted portions of the light and for comparing this ratio to a predetermined threshold value to obtain an indication of resonance phenomena within the HBAR. This circuitry also measures the diffraction angle of the diffracted portion of the light to determine the frequency of the microwave signal.

The circuitry of this invention performs a method of measuring resonance phenomena which comprises the steps of: applying a microwave signal to a high overtone bulk acoustic resonator, thereby creating an acoustic wave within the HBAR; passing a light through the HBAR resonator such that the light is diffracted in response to the presence of an acoustic wave; measuring the intensity of diffracted and undiffracted portions of the light; and comparing the ratio of the measured intensities of the diffracted and undiffracted portions of light to a predetermined threshold value to obtain an indication of resonance phenomena within the HBAR when said ratio exceeds said threshold value. Once an indication of resonance is present, the angle of the diffracted portion of the light can be used to determine the frequency of the microwave signal at which the resonance occurred.

This invention uses an HBAR cavity as its own Bragg diffractor to permit optical readout of microwave resonance phenomena in a manner completely independent of the microwave circuitry. The use of optical diffraction means to extract information about acoustic waves propagating in transparent crystalline media is well known, as demonstrated by conventional Bragg cells. In practice, the HBAR cavity would be designed first from an acoustic standpoint to function effectively as a high Q microwave filter. Only secondarily would it be modified to benefit Bragg diffractor behavior such as with the addition of optical quality entrance and exit faces. Such secondary modifications are limited to those that do not affect the HBAR's microwave performance.

DESCRIPTION OF THE PREFERRED EMBODIMENTS

Figure 1:
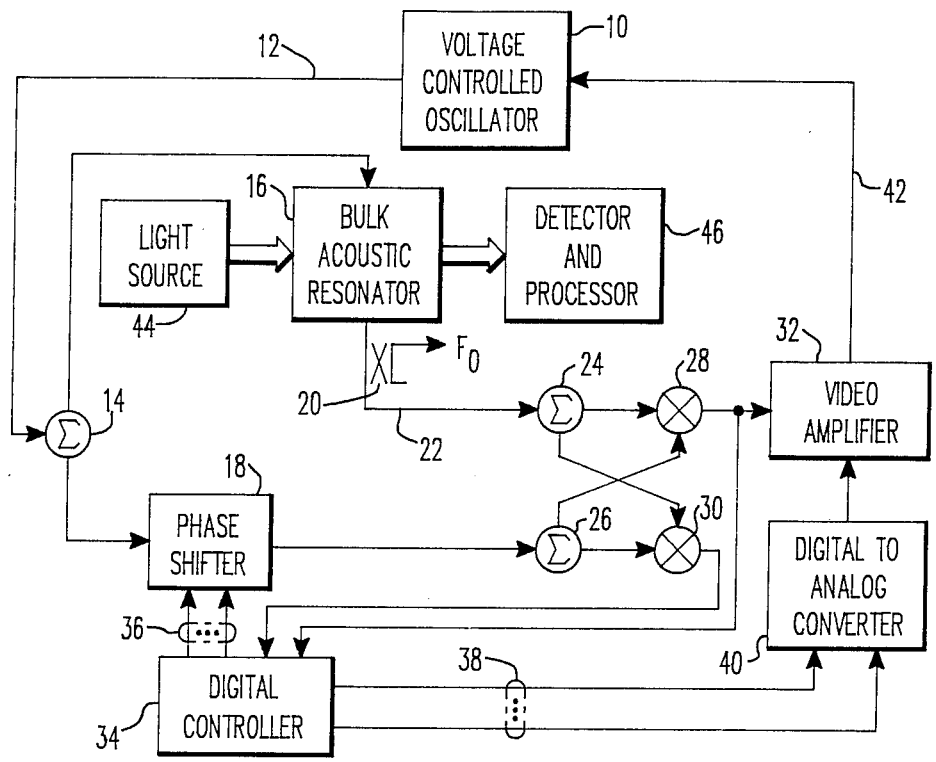
FIG. 1 is a block diagram of a microwave oscillator circuit constructed in accordance with one embodiment of the present invention.

Referring to the drawings, FIG. 1 is a block diagram of a microwave oscillator circuit constructed in accordance with one embodiment of the present invention. A voltage controlled oscillator 10 produces a microwave frequency output on line 12 which is fed through junction point 14 to a high overtone bulk acoustic resonator 16 and a phase shifter 18. Coupler 20 extracts the output signal $F_O$ from the output of the HBAR on line 22. Summation points 24 and 26, quadrature mixer 28 and in-phase mixer 30 are connected as illustrated to provide an input signal to a video amplifier 32 and a digital controller 34. The digital controller controls the operation of phase shifter 18 by way of lines 36 and produces an output on lines 38 which is transformed by a digital to analog converter 40 to provide a second input to the video amplifier 32. The video amplifier then provides a tuning voltage on line 42 to adjust the frequency of the voltage controlled oscillator 10. All of the circuitry described to this point is available in the prior art. This invention further includes a light source 44 which directs a beam of light through the HBAR to a detector and processor 46.

Figure 2:
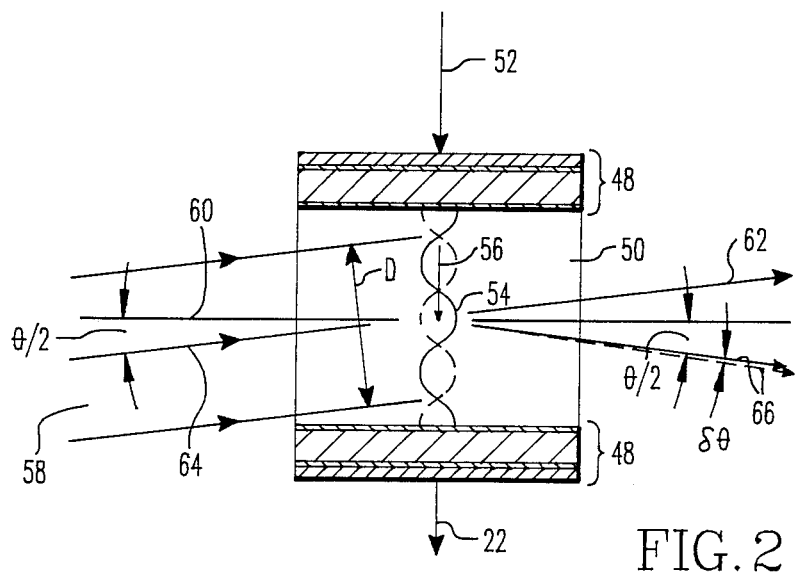
FIG. 2 is a schematic diagram which illustrates the operation of the HBAR as a Bragg diffractor.

Suppose, for the purposes of discussion, that the HBAR 16 in FIG. 1 has locked the VCO 10 to a particular HBAR resonance. In this situation, acoustic compression waves within the HBAR at the phase locked frequency exhibit maximum amplitude at resonance, which corresponds to the formation of an acoustic standing wave pattern within the HBAR. This wave pattern results in large changes in the refractive index n of the HBAR and produces a stationary phase grating of high diffraction efficiency which behaves as a Bragg diffractor for light traversing an axis which is substantially orthodgonal to the acoustic axis. This situation is illustrated in the schematic diagram of FIG. 2. The high overtone bulk acoustic resonator 16 includes a pair of microwave acoustic transducers 48 on opposite sides of a resonating cavity 50. The output of the voltage controlled oscillator 10 in FIG. 1 produces a microwave signal which is applied to the microwave input 52 of the HBAR. At resonance, this produces a standing acoustic wave 54 along the acoustic axis 56. A spatially coherent input light beam 58 is directed into the resonant cavity at an ange $\theta/2$ to the geometric axis 60. A diffraction grating is created by the standing acoustic wave such that an undiffracted (0 order) beam 62 exits the HBAR along the input optical axis 64, and a diffracted (+1 order) beam 66 exits the HBAR at some Bragg diffraction angle which is dependent upon the frequency of the input microwave signal. It should be noted that the exact angle of the incident light beam is not critical to this invention.

Under resonant conditions, the maximum intensity diffracted (+1 order) light beam is accompanied by a simultaneous minimum in the undiffracted (0 order) beam. Now if phase lock is broken and the VCO is slewed to a frequency well removed from an HBAR resonance, the resulting multiply reflected forward and reverse acoustic waves within the resonator cavity act as superimposed phase gratings whose relative phase is varying with the input frequency. These randomly positioned phase gratings interfere to yield low efficiency diffraction in the +1 order at various angles, with most of the transmitted energy being concentrated in the undiffracted 0 order. If both beams (0 and +1 orders) leaving the HBAR Bragg diffractor are focused onto a linear photosensor which converts the optical readout into electrical signals representing the beam angle and intensity, the individual HBAR microwave resonances can be identified.

The primary means by which a specific HBAR resonance—perhaps one out of some 200 resonances—is identified is the measurement of the angular deflection of the +1 diffracted order. The angular deflection is measured by determining the position of the +1 order's focussed spot on either a scanned photodetector array or a silicon position sensor. Initial calibration of the system relates spot position to resonance frequency. Once the stable local oscillator is locked to a particular resonance, or slews through it, a strong position signal indicates dwell upon or passage through a specific resonance. In the latter case, the signal duration is a function of slew rate, i.e., dwell time.

In a typical frequency agile situation, the VCO will be slewed towards a specific HBAR resonance under direction from the digital controller. As resonance is approached, an indication of how close to the desired resonance the VCO has come is needed so that when the slew signal is removed, the phase locked loop will close on that resonance. That is, the system must slew to within the loop's pull-in range to guarantee lock up on the desired resonance, but control of the VCO does not have to be so precise that it must be slewed exactly onto resonance. The contrast ratio between zero and +1 order focused spot intensities is a measure of how close to resonance the VCO has slewed. When a predetermined threshold contrast ratio is exceeded the VCO stops slewing and the phase-locked loop automatically pulls the VCO into the resonance. Confirmation of this is derived from the spot position signal.

This action is similar to that of an optical spectrum analyzer with the important difference that the acoustic resonances exhibited by the HBAR are exploited to maximize the power (intensity) contrast or ratio between the 0 and +1 orders. That is, maximum contrast exists precisely at resonance. A second important difference is that conventional optical spectrum analyzers have tight specifications in order to separate simultaneous closely spaced signals over a wide dynamic range. This is reflected in critical optics requirements to achieve diffraction limited behavior and low diffraction envelope side lobes at the linear photosensor. The technique described herein is not critical in these respects as it is only necessary to detect the motion of a single focused spot, and the dynamic range problem should be minimal in view of the high contrast between the spot intensity and the diffuse radiation background. It follows that less critical, less expensive optics can be quite acceptable, and that centroiding techniques applied to the photosensor can significantly enhance frequency (angular) resolution, permitting detection of very small spot centroid motions.

It should be noted that high efficiency Bragg diffraction is realizable only if the Bragg Q criterion is satisfied ($Q \geq 4\pi$), however, existing HBAR devices exhibit acoustic column widths in yttrium aluminum garnet (YAG) material which yield Q's of approximately 15. For large numbers of internal reflections in the HBAR (e.g. more than 100) the acoustic column length may be great enough that diffraction and bulk attenuation effects begin to degrade Bragg grating behavior. Hence, low loss material is essential and anisotropy may help to limit acoustic diffraction. Existing HBAR resonators in YAG material appear to exhibit anisotropic effects which constrain diffraction and maintain resonator acoustic Q. This would benefit the Bragg diffraction mechanism also because this suggests that both loss and diffraction effects are far from catastrophic.

Figure 3:
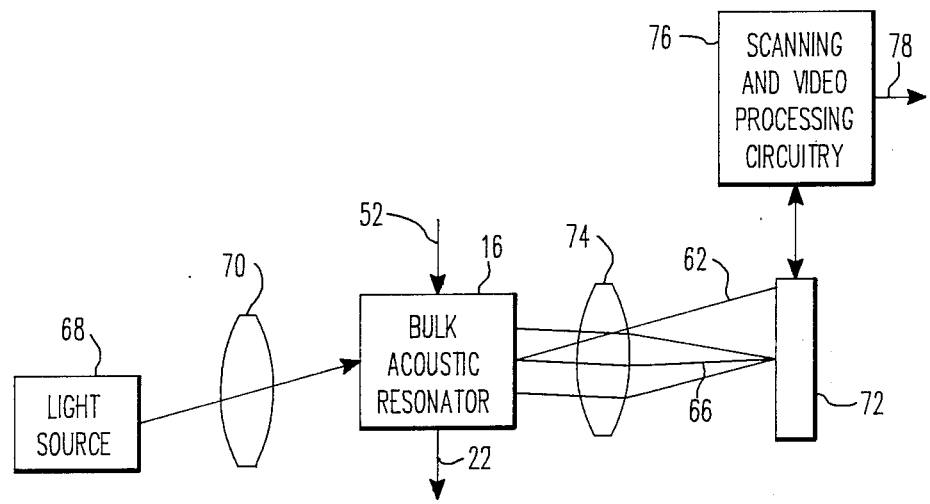
FIG. 3 is a block diagram of the optical readout portion of the circuit of FIG. 1.

FIG. 3 illustrates a general arrangement for an optical readout system for the HBAR of FIG. 1. The optical source 68 is a buried heterostructure (BH) laser diode typically operating at 830 nanometers wavelength. The BH laser is advantageous in exhibiting a low threshold current and small power requirements and is available with a low aspect ratio exit aperture which reduces XY plane beam asymmetry. Typical XY beam angles are 30° by 50°. Such an optical source would include a photodetector receiving light from the rear facet of the laser. This photodetector is used to close a feedback loop containing the laser power supply. This stabilizes the laser diode current and hence optical power output at a preselected value. The Bragg diffractor beam geometry is such that direct specular reflection of optical energy back into the laser is unlikely.

This is important because unwanted reflections can destabilize laser diode operation and enhance intrinsic laser noise. Reflected energy may be further reduced if necessary by employing antireflection coatings on all significant optical surfaces. By appropriate selection of the gaussian beam waist relay optic lens 70 focal length and location with respect to the laser aperture, the laser's gaussian beam waist may be imaged either at the relay lens itself (for a collimated beam incident upon the HBAR) or inside the HBAR cavity, with the new beam waist dimensions being commensurate with the HBAR usable aperture. The relay optics would normally use a single lens providing diffraction limited resolution, but if necessary for reasons of greater design flexibility, a train of such lenses may also be used. The HBAR cavity itself is necessarily constructed of materials which exhibit a high acoustic Q at microwave frequencies, such as yytruim aluminum garnet (YAG), lithium niobate and lithium tantalate. All of these are available in good optical quality and are transparent over a broad range of wavelengths including 830 nanometers. Lithium tantalate is of special interest as a resonator material because a crystal cut is available featuring zero temperature coefficient. Optical quality entrance and exit facets are necessary on the HBAR cavity, and such faces have already been achieved in other devices which use the above materials. The 0 and +1 order beams leaving the HBAR cavity are focused onto an electronically scanned linear photodiode array 72 by a second diffraction limited lens 74 whose focal length is chosen to suit the detection technique. Scanning and processing circuitry 76, which may include a controiding function, receives signals from the photodiode array and produces an output signal on line 78 which provides an indication of the resonance phenomena occuring within the HBAR cavity by comparing the intensities of the diffracted and undiffracted portions of light and determining the location of the diffracted light. The scanning and processing circuitry can be constructed in accordance with known technology.

Ideally, one would like to achieve a one-to-one correspondence between a specific HBAR resonance and a specific detector element in the scanned array. Thus, assuming the use of a 256 element, high resolution linear detector array (7 micron squares on 7 micron centers) and a focal length F of 0.37 inches, then if the HBAR resonances are spaced 13.6 megahertz apart, 73 detector elements can correspond to the same number of discrete microwave frequencies assuming a 1 gigahertz HBAR bandwidth. The intensity of light falling on the diode array will be a function of the electrical signal amplitude fed to the HBAR and how close in frequency this signal is to the HBAR resonance of interest. If the array scan rate is say 20 megahertz then frequency location and amplitude can be retrieved in approximately 15 microseconds allowing time for the processing electronics to determine which array element produces the greatest signal differential relative to the 0 order element. In the event that the sensing of more closely spaced HBAR resonances is required (say 5 megahertz spacing), the same high resolution sensor array may be used but in the example given above the focal length F must be increased by a factor of 2.8 and this in turn increases the focused spot size by the same ratio so that the energy is spread over several elements. A centroiding function in the processing electronics can compensate for this, but data retrieval time will increase. An alternative and preferred detection technique is to use a silicon linear position photosensor which can achieve a very significant cost and complexity reduction together with data retrieval times on the order of 10 microseconds. The very precise microlithography established baseline of the scanned array is lost, but means are available to maximize the photosensor's linearity. That is, ±0.1% linearity can be achieved in the compressed operating range of the device using only the central half of the active length. The linear photosensor is self centroiding in operation and can easily sense a 2.5 micron shift corresponding to a five magahertz resonance spacing. This feature keeps the focal length small for compact design. A secondary benefit of the self centroiding feature is that position resolution is not degraded when the focused spot on the sensor increases in size from the 7 micron diameter discussed above to at least 200 microns in diameter.

Thus, precise location of the sensor in the focal plane of the focusing optics or at the gaussian beam waist is no longer critical and nondiffraction limited optics may also be used. To capture 0 order information, it is necessary to employ a separate photodetector mounted directly on the surface of the linear position sensor. Typical circuitry employed to readout the position signal is much less complex than scanned array electronics. The use of ratio circuitry is necessary to preclude position signal errors consequent upon changes of total intensity resulting from unavoidable variations in focused spot intensity and position. Spot intensity data (maximum at an HBAR resonance) can be obtained from the sum channel provided that a spot position correlation multiplier derived from the position signal is applied.

Table I provides example parameters which may be used in an embodiment of this invention. These parameters are based upon known properties of YAG material, specific values of HBAR cavity thickness and micoowave/acoustic transducer aperture dimensions, and microwave center frequency.

TABLE I

Example System Parameters

Assumptions:

| | |
|---|---|
| Center Frequency | $f_c = 1.65$ GHz |
| YAG Acoustic Velocity | $v_a = 8560$ m/sec |
| Acoustic Wavelength | $\Lambda = 5.2 \times 10^{-6}$ m |
| Laser Wavelength | $\lambda_o = 830$ nm |
| YAG Refractive Index | $n \sim 1.8$ (at $\lambda_o$) |
| Cell Wavelength | $\lambda_c = \dfrac{\lambda_o}{n} = 461$ nm |
| HBAR Transducer Aperture | $A = 6.3 \times 10^{-8}$ m$^2$ |
| HBAR Equivalent Aperture Diameter | $w = 142 \times 10^{-6}$ m |
| HBAR Usable Optical Aperture | $D = 625 \times 10^{-6}$ m |
| HBAR Thickness | 0.03 in. |

Calculations:

$$\text{Bragg Criteria } Q = \frac{2\pi w \lambda_c}{\Lambda^2} \sim 15.2$$

$$\text{Bragg Angle } \frac{\theta}{2} = \sin^{-1}\left(\frac{\lambda_c f_c}{2 v_a}\right) = 44.3 \times 10^{-3} \text{ Rad}$$

$$\text{Time Aperture } T_a = \frac{D}{v_a} = 73 \text{ nsec.}$$

$$\text{Number of Resolvable Spots } N = T_a \Delta f = 179$$

$$\text{Frequency Resolution } FR = \frac{1}{T_a} = 13.7 \text{ MHz}$$

Width of Bragg Acoustic Diffraction Envelope $$\Delta f = \frac{2 n^2 f_c \Lambda^2}{w \lambda_o} = 2.45 \text{ GHz}$$

It is important to note that although 179 focused spots spaced 13.7 megahertz apart are theoretically resolvable on a 7 micron pitch detector array by the Bragg diffractor (each spot centroid being centered on its own detector element), This represents much larger microwave bandwidth (2.45 gigahertz) than that of the HBAR cavity, which is closer to 1 gigahertz. Thus the HBAR bandwidth restriction limits the number of resonances observable to 73 under these conditions. However, as noted earlier, by increasing the focal length by a factor of 2.8 and using centroiding, or through the use of a linear position photosensor, the effective detector array pitch may be reduced to 2.5 microns enabling the resolution of about 200 resonances in the 1 gigahertz HBAR bandwidth under single spot conditions.

Figure 4:
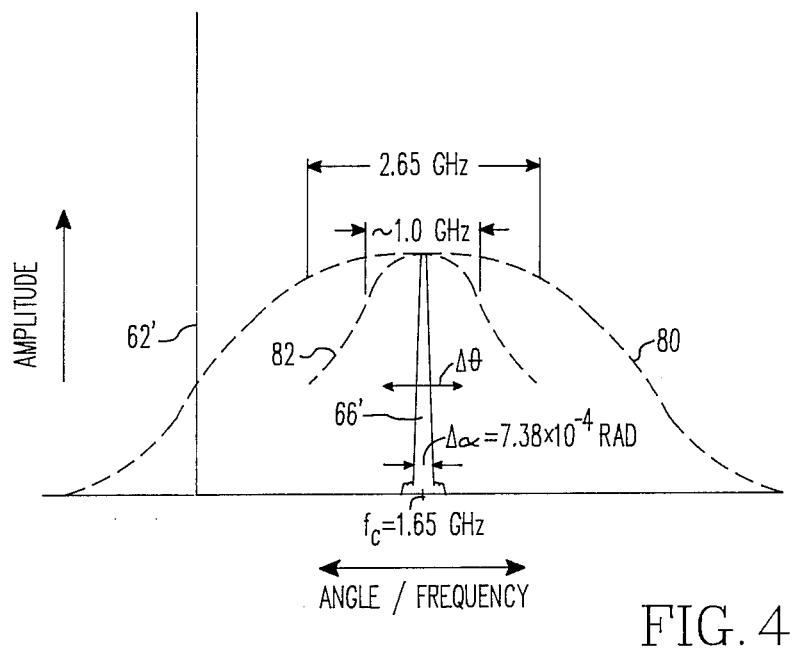
FIG. 4 is a plot of the relationships between the amplitude of the diffracted and undiffracted portions of light, and the diffraction angle and acoustic frequency of the HBAR.

FIG. 4 illustrates the relationships between the 0 and +1 orders, 62' and 66' respectively, the latter being located at the center frequency of 1.65 gigahertz assuming that an HBAR resonance occurs precisely at this frequency. The angular width $\Delta\alpha$ of the +1 order and the focusing optics focal length determine the spot size at the photosensor. Curve 80 represents the Bragg acoustic diffraction envelope which at the −4 db points has an angular width $\Delta\theta$ of 0.132 radians corresponding to a bandwidth, $\Delta f$, of 2.45 GHz. This means that the HBAR crystal, if it were to act purely as a Bragg cell, i.e., exhibit no acoustic resonances, would deflect the +1 order over a 0.132 radian angular range as the microwave input frequency varied ±1.225 GHz about the center frequency $f_c = 1.65$ GHz. However, the HBAR does exhibit acoustic resonances, and the occurrence of these is restricted to a bandwidth of ~1.0 GHz. This is represented by the envelope shown as curve 82. FIG. 4 thus shows that the number of resolvable spots (corresponding to discrete resonance frequencies) is limited to 73 by the HBAR resonance envelope, not by the Bragg diffraction phenomenon which could resolve 179 spots.

Both curves 80 and 82 represent intensity envelopes. That is, they define the maximum intensity (amplitude on FIG. 4) of the diffracted +1 order as a function of angle/frequency. Note that the maximum intensity of the +1 order only occurs at an HBAR resonance, while the intensity of the zero order is minimum at resonance. Between resonances the +1 order intensity could be reduced by more than 20 db.

It shoud now be apparent that this invention uses an HBAR cavity in a microwave oscillator circuit as its own Bragg diffractor to permit optical readout of microwave resonance phenomena in a manner completely independent of the microwave circuitry. The HBAR cavity would be designed first from an acoustic standpoint to function objectively as a high Q microwave filter and only secondarily modified to benefit Bragg diffractor behavior. The readout sensitivity of the resonance phenomena is enhanced by exploitation of the HBAR acoustic standing wave pattern existing at a microwave resonance to achieve a well defined phase grating with a high change in refractive index. Thus a large contrast ratio in diffracted light intensity is achieved between the on and off resonance states. The latter being characterized by randomly phased traveling wave patterns which behave as interfering phase gratings and exhibit low diffraction efficiency in a given angular regime. This invention allows the use of linear position sensor technology to achieve savings in volume, optical design simplification, circuit complexity, and cost relative to more conventionally employed scanned array technology without sacrifice of data retrieval time or data quality. An important application of this invention is its use in the field of radar stable local oscillators, particularly frequency agile oscillators. This technique enables very rapid and reliable determination of the particular HBAR resonance in use, and inherently offers excellent frequency resolution enabling the use of more numerous and more closely spaced HBAR resonances.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A microwave oscillator circuit with an optical readout of resonance phenomena comprising:
   a voltage controlled oscillator for producing a controllable frequency microwave signal;
   a high overtone bulk acoustic resonator coupled to receive said microwave signal, thereby creating acoustic waves along an acoustic axis within said high overtone bulk acoustic resonator;
   means for passing a light through said high overtone bulk acoustic resonator in a direction substantially orthogonal to said acoustic axis, such that said light is diffracted in response to the presence of said acoustic waves in said high overtone bulk acoustic resonator; and
   means for measuring the ratio of intensities of diffracted and undiffracted portions of said light and for comparing said ratio to a predetermined threshold value to obtain an indication of resonance phenomena within the high overtone bulk acoustic resonator when said ratio exceeds said threshold value.

2. An oscillator as recited in claim 1, further comprising:
   means for determining the diffraction angle of said diffracted portion of said light, said diffraction angle being proportional to the frequency of said microwave signal.

3. An oscillator as recited in claim 1, wherein:
   said diffracted portion of said light is in a plus one order beam.

4. An oscillator as recited in claim 1, wherein said light is spatially coherent.

5. A method of measuring resonance phenomena in a microwave oscillator comprising the steps of:
   applying a microwave signal to a high overtone bulk acoustic resonator, thereby creating acoustic waves along an acoustic axis within said high overtone bulk acoustic resonator;
   passing a light through said high overtone bulk acoustic resonator in a direction substantially orthogonal to said acoustic axis, such that said light is diffracted in response to the presence of said acoustic waves in said high overtone bulk acoustic resonator;
   measuring the intensity both diffracted and undiffracted portions of said light; and
   comparing the ratio of said measured intensities of said diffracted and undiffracted portions of said light to a predetermined threshold value to obtain an indication of resonance phenomena within the high overtone bulk acoustic resonator when said ratio exceeds said threshold value.

6. The method of claim 5, further comprising the step of:

measuring the diffraction angle of said diffracted portion of said light, said diffraction angle being proportional to the frequency of said microwave signal.

7. The method of claim 5, wherein:

the diffracted portion of said light is a plus one order beam.

* * * * *